United States Patent
Yumoto et al.

(10) Patent No.: US 10,202,309 B2
(45) Date of Patent: Feb. 12, 2019

(54) CUBIC BORON NITRIDE SINTERED BODY CUTTING TOOL

(71) Applicant: MITSUBISHI MATERIALS CORPORATION, Tokyo (JP)

(72) Inventors: Kenji Yumoto, Anpachi-gun (JP); Yosuke Miyashita, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/128,871

(22) PCT Filed: Mar. 27, 2015

(86) PCT No.: PCT/JP2015/059572
§ 371 (c)(1),
(2) Date: Sep. 23, 2016

(87) PCT Pub. No.: WO2015/147249
PCT Pub. Date: Oct. 1, 2015

(65) Prior Publication Data
US 2017/0101346 A1  Apr. 13, 2017

(30) Foreign Application Priority Data

Mar. 28, 2014 (JP) ................................. 2014-069233
Mar. 20, 2015 (JP) ................................. 2015-058192

(51) Int. Cl.
C04B 35/5831 (2006.01)
C04B 35/645 (2006.01)
(Continued)

(52) U.S. Cl.
CPC ...... *C04B 35/5831* (2013.01); *C04B 35/6261* (2013.01); *C04B 35/645* (2013.01);
(Continued)

(58) Field of Classification Search
None
See application file for complete search history.

(56) References Cited

U.S. PATENT DOCUMENTS

2007/0134494 A1   6/2007  Dole et al.
2012/0035045 A1   2/2012  Fukushima et al.
(Continued)

FOREIGN PATENT DOCUMENTS

CN       1986487 A     6/2007
CN     101848782 A     9/2010
(Continued)

OTHER PUBLICATIONS

Angseryd et al. "Detailed microstructure of a cBN based cutting tool material", *International Journal of Refractory Metals and Hard Materials*, Mar. 2009, pp. 249-255, vol. 27, Issue 2.
(Continued)

*Primary Examiner* — Colleen P Dunn
*Assistant Examiner* — Ross J Christie
(74) *Attorney, Agent, or Firm* — Leason Ellis LLP (57) ABSTRACT

A cBN sintered material cutting tool is provided. The cBN cutting tool includes a cutting tool body, which is a sintered material including cBN grains and a binder phase, wherein the sintered material comprises: the cubic boron nitride grains in a range of 40 volume % or more and less than 60 volume %; and Al in a range from a lower limit of 2 mass % to an upper limit Y, satisfying a relationship, Y=−0.1X+ 10, Y and X being an Al content in mass % and a content of the cubic boron nitride grains in volume %, respectively, the binder phase comprises: at least a Ti compound; $Al_2O_3$; and inevitable impurities, the $Al_2O_3$ includes fine $Al_2O_3$ grains with a diameter of 10 nm to 100 nm dispersedly formed in (Continued)

the binder phase, and there are 30 or more of the fine $Al_2O_3$ grains generated in an area of 1 μm×1 μm in a cross section of the binder phase.

16 Claims, 3 Drawing Sheets

(51) Int. Cl.
| | |
|---|---|
| *C04B 35/626* | (2006.01) |
| *C23C 16/34* | (2006.01) |
| *C22C 26/00* | (2006.01) |
| *C04B 41/52* | (2006.01) |
| *C04B 41/50* | (2006.01) |
| *C04B 37/02* | (2006.01) |

(52) U.S. Cl.
CPC ........ *C04B 37/026* (2013.01); *C04B 41/5068* (2013.01); *C04B 41/52* (2013.01); *C22C 26/00* (2013.01); *C23C 16/34* (2013.01); C04B 2235/3217 (2013.01); C04B 2235/3804 (2013.01); C04B 2235/3813 (2013.01); C04B 2235/3843 (2013.01); C04B 2235/3856 (2013.01); C04B 2235/3865 (2013.01); C04B 2235/3886 (2013.01); C04B 2235/5436 (2013.01); C04B 2235/5445 (2013.01); C04B 2235/5454 (2013.01); C04B 2235/5472 (2013.01); C04B 2235/604 (2013.01); C04B 2235/661 (2013.01); C04B 2235/781 (2013.01); C04B 2235/785 (2013.01); C04B 2235/80 (2013.01); C04B 2235/81 (2013.01); C04B 2237/125 (2013.01); C04B 2237/36 (2013.01); C04B 2237/401 (2013.01); C22C 2026/003 (2013.01)

(56) References Cited

U.S. PATENT DOCUMENTS

| | | | |
|---|---|---|---|
| 2012/0055099 A1* | 3/2012 | Bao .......................... | B01J 3/062 51/309 |
| 2012/0282050 A1* | 11/2012 | Setoyama ........... | C04B 35/5831 407/118 |
| 2013/0079215 A1* | 3/2013 | Okamura .............. | C04B 35/117 501/87 |

FOREIGN PATENT DOCUMENTS

| | | |
|---|---|---|
| EP | 0695731 A | 2/1996 |
| EP | 2420483 A | 2/2012 |
| EP | 2426229 A | 3/2012 |
| JP | 07-266106 A | 10/1995 |
| JP | 08-081270 A | 3/1996 |
| JP | 3476507 B | 12/2003 |
| JP | 2011-189421 A | 9/2011 |
| JP | 2011-207689 A | 10/2011 |
| JP | 5189504 B | 4/2013 |
| JP | 2013-255986 A | 12/2013 |
| WO | WO-2007/113643 A | 10/2007 |
| WO | WO-2010/119962 A | 10/2010 |

OTHER PUBLICATIONS

International Search Report dated May 26, 2015 for the corresponding PCT Application No. PCT/JP2015/059572.
Office Action dated Jul. 4, 2017 for the corresponding Chinese Patent Application No. 201580016231.4.
Extended European Search Report dated Oct. 12, 2017 for the corresponding European Patent Application No. 15768238.6.

* cited by examiner

FIG. 3B

CUBIC BORON NITRIDE SINTERED BODY CUTTING TOOL

CROSS-REFERENCE TO RELATED PATENT APPLICATIONS

This application is a U.S. National Phase Application under 35 U.S.C. § 371 of International Patent Application No. PCT/JP2015/059572, filed Mar. 27, 2015, and claims the benefit of Japanese Patent Applications No. 2014-069233, filed Mar. 28, 2014 and No. 2015-058192, filed Mar. 20, 2015, all of which are incorporated by reference herein in their entireties. The International Application was published in Japanese on Oct. 1, 2015 as International Publication No. WO/2015/147249 under PCT Article 21(2).

FIELD OF THE INVENTION

The present invention relates to a cutting tool having the cutting tool body that is the cBN sintered material, which is sintered under ultra-high pressure and temperature by using cubic boron nitride (hereinafter indicated as cBN) as the major component. Particularly, the present invention relates to a cBN sintered material cutting tool that excels in strength and toughness; excels in abrasion resistance and fracturing resistance particularly in cutting work of alloy steel, bearing steel and high hardness steel; and is capable of retaining excellent cutting performance for a long-term usage.

BACKGROUND OF THE INVENTION

Conventionally, cBN sintered material cutting tools and the like, which have cutting tool bodies made of cBN sintered materials, are known as cutting tools for high hardness steel and various proposals have been made in order to improve their tool lives.

For example, Patent Literature 1 (PTL 1) discloses a cBN sintered material tool, in which reduction of the thermal conductivity of the tool body balances with improvement of the hardness of the tool body. In the cBN sintered material tool disclosed in PTL 1, the cBN sintered material includes cBN, the insulation phase, and the binder phase; cBN is included in the cBN sintered material from 60 volume % or more to less than 99 volume %; the insulation phase includes at least one or more of the first compound made of one or more elements selected from the group consisting of Al, Si, Ti and Zr and one or more elements selected from the group consisting of N, C, O, and B; the first compound is included in the cBN sintered material from 1 mass % or more to 20 mass % or less and has the average gran size of less than 100 nm; and the cBN sintered material has the thermal conductivity of 70 W/m·K or less.

In addition, Patent Literature 2 (PTL 2) discloses a cBN sintered material, in which fracturing resistance balances with abrasion resistance at a high level. In the cBN sintered material disclosed in PTL 2, the cBN sintered material includes cBN and the binder phase; the cBN is included in the cBN sintered material from 25 volume % or more to 80 volume % or less; the binder phase includes the Ti compound group; the Ti compound group includes one or more compounds containing at least Ti; the binder phase includes the first fine grain component constituted from grains having the grain size of 0.1 μm or less; and the first fine grain component occupies 10% to 60% of the area occupied by the binder phase at least in a cross-section of the cBN sintered material.

In addition, Patent Literature 3 (PTL 3) discloses a cBN sintered material, in which strength, toughness, and abrasion resistance are improved. In the cBN sintered material disclosed in PTL 3, the cBN sintered material includes: at least one selected from the group consisting of nitride, carbide, boride, oxide of the periodic table group 4a elements, the group 5a elements, the group 6a elements, and a solid solution thereof; at least one selected from the group consisting of an elemental substance of Zr, Si, Hf, Ge, W, and Co, a compound thereof, and a solid solution thereof; and an Al compound, as the bonding material. Furthermore, in the sintered material disclosed in PTL 3, the total content of W and/or Co is less than 0.5 weight %; the content of Si or Zr is 0.01 weight % or more and less than 0.5 weight %; Si/(Si+W+Co) or Zr/(Zr+W+Co) is 0.05 or more and 1.0 or less; the average grain size of TiN and $TiB_2$, which are the Ti compound, is 100 nm or more and 400 nm or less; and the average grain size of $AlB_2$ and AlN, which are the Al compound, is 50 nm or more and 150 nm or less.

RELATED ART DOCUMENTS

Patent Literature

PTL 1: Japanese Unexamined Patent Application, First Publication No. 2011-189421 (A)
PTL 2: Japanese Unexamined Patent Application, First Publication No. 2011-207689 (A)
PTL 3: Japanese Patent (Granted) Publication No. 5189504 (B)

Problems to be Solved by the Present Invention

In the cBN sintered material disclosed in PTL 1, the thermal conductivity becomes 70 W/m·K or less because: the first compound made of one or more elements selected from the group consisting of Al, Si, Ti and Zr and one or more elements selected from the group consisting of N, C, O, and B is included in the cBN sintered material from 1 mass % or more to 20 mass % or less as the component of the insulation phase; and the average grain size of the first compound is less than 100 nm. However, the sintered material disclosed in PTL 1 has a problem that a sufficient cutting performance cannot be obtained and the tool life becomes short when the cBN content is less than 60 volume %.

In the cBN sintered material disclosed in PTL 2, the fracturing resistance balances with abrasion resistance at a high level because: the cBN sintered material includes cBN and the binder phase; the cBN is included in the cBN sintered material from 25 volume % or more to 80 volume % or less; the binder phase includes the Ti compound group; the Ti compound group includes one or more compounds containing at least Ti; the binder phase includes the first fine grain component constituted from grains having the grain size of 0.1 μm or less; and the first fine grain component occupies 10% to 60% of the area occupied by the binder phase at least in a cross-section of the cBN sintered material. However, in the sintered material disclosed in PTL 2, only the grain size of the TiN compound group is regulated and grain sizes of other binder phase components cannot be regulated. Thus, by forming coarse $Al_2O_3$, AlN, and AlB grains, for example, cracks are formed and extended easily, because the coarse grains turn into starting points of the cracks. Therefore, it causes reduction of toughness of the cBN sintered material.

In the cBN sintered material disclosed in PTL 3, strength, toughness, and abrasion resistance are improved: by including W and/or Co and Si or Zr at the predetermined contents as the bonding material; and by setting the average grain size of TiN and $TiB_2$ and the average grain size of the $AlB_2$ and AlN in the predetermined ranges. However, the cBN sintered material disclosed in PTL 3 does not have a sufficient fracturing resistance in the cutting condition where high load of the high hardness steel is applied on the tool.

The present invention is made under the circumstance explained above. The purpose of the present invention is to provide a cBN sintered material cutting tool in which chipping and fracturing of the cutting edge is less and an excellent cutting performance is retained for a long-term usage, even in cutting work of high hardness steel in which high load cutting condition is required.

SUMMARY OF THE INVENTION

Means to Solving the Problems

In order to solve the problems, the inventors of the present invention conducted intensive studies focusing on the components of the binder phase of the cBN sintered material constituting the cBN tool, and obtained the findings explained below.

(1) Strength and fracture toughness improve due to suppression of propagation of extending cracks during use of the tool without deteriorating the abrasion resistance of the binder phase by: controlling the grain size of $Al_2O_3$, which has a different thermal expansion coefficient to that of the Ti compound, to the diameter of 10 nm to 100 nm; and having the $Al_2O_3$ grains evenly be dispersed in the binder phase, in addition to the Ti compound that is the major component of the binder phase.

(2) In the cBN sintered material having the above-described binder phase, fracturing resistance improves significantly, while abrasion resistance is maintained.

(3) As a result, by having the above-described cBN sintered material be the cutting tool body of the cutting tool, a cutting tool less likely to be fractured and having an extended tool life can be obtained.

By conducting many experiments and based on the above-described findings, the inventors of the present invention succeeded to produce tools less likely to be fractured and having long cutting lives even if they are used in cutting of high hardness steel in which high load and high temperature are applied on their cutting edges. The cBN sintered material having the binder phase, which is specially configured for the cBN sintered material cutting tool related to the present invention (hereinafter, referred as "the cBN sintered material cutting tool of the present invention" or "the cBN cutting tool of the present invention"), can be formed by the method explained below, for example.

(a) Crushing process of the raw material powders for the binder phase formation:

First, ultra-fine $Al_2O_3$ grains (the average grain size is 5 nm to 15 nm) are added to the raw material powders for the binder phase formation in order to facilitate nucleation of fine $Al_2O_3$ grains and uniform dispersion thereof. Next, the raw material powders for the binder phase formation are finely crushed. To the raw material powders for binder phase formation, $Al_2O_3$; and/or Al and $Al_2O_3$ having the grain size of 10 nm to 100 nm are added. In the raw material powders for binder phase formation, the total content of Al in the sintered material is set to a range from the lower limit of 2 mass % to the upper limit Y, satisfying a relationship, $Y=-0.1X+10$, Y and X being the Al content in mass % and the content of the cubic boron nitride grains in volume %, respectively, (b) Molding process:

The preliminary sintered material is made by making the compact with a predetermined size and sintering the compact under the vacuum atmosphere at the pressure of $1 \times 10^{-4}$ Pa or less at 900° C. to 1300° C. after mixing and stirring cBN grains and the binder phase powder obtained in the above-described process (a) in such a way that the content of the cBN grains in the sintered material becomes 40 volume % or more and 60 volume % or less.

(c) Sintering process:

Then, the preliminary sintered material is inserted into the ultra-high pressure sintering apparatus in the state where the preliminary sintered material and the supporting piece made of WC-based cemented carbide alloy are stacked each other; and is subjected to ultra-high pressure and temperature sintering under the condition where: the pressure is 5 GPa; the temperature is 1200° C. to 1400° C.; and the retention time is 30 minutes, for example, to make the cBN sintered material.

(d) Binder phase structure forming process:

The binder phase structure is formed in the binder phase of the cBN sintered material, which is obtained by performing the ultra-high pressure and temperature sintering, by adding the ultra-fine $Al_2O_3$ grains, which facilitate nucleation of the fine $Al_2O_3$ grains and uniform dispersion thereof, and crushing the raw material powders finely in the crushing process (a). In the binder phase structure, 30 or more of the fine $Al_2O_3$ grains, which are nucleated from the ultra-fine $Al_2O_3$ grains and having the diameter of 10 nm to 100 nm, are dispersedly formed in the area of 1 μm×1 μm in the cross section of the binder phase. In other words, the fine $Al_2O_3$ grains with the diameter of 10 nm to 100 nm are uniformly dispersed in the binder phase.

In this specification, the fine $Al_2O_3$ grains are defined as $Al_2O_3$ having the grain size of 100 nm or less; and among them, ones with the average grain size of 5 nm to 15 nm are defined as the ultra-fine $Al_2O_3$ grains.

When a cBN sintered material cutting tool is made from the cBN sintered material made as described above, there is less cracking during cutting of high hardness steel, in which high load and temperature are applied on the cutting edge in the cBN tool; and the cBN tool has excellent chipping resistance and fracturing resistance, while abrasion resistance is retained. As a result, the cBN tool exhibits excellent cutting performance for a long-term usage.

In other words, in the above-described cBN sintered material cutting tool, strength and fracture toughness can be improved without deteriorating the abrasion resistance by regulating the $Al_2O_3$ grains in the binder phase of the cBN sintered material to a predetermined grain size. Therefore, by using the cBN sintered material as the cutting tool, the tool life of the cutting tool can be extended.

The present invention is made based on the above-explained findings, and has aspects shown below.

(1) A cubic boron nitride sintered material cutting tool including a cutting tool body, which is a sintered material including cubic boron nitride grains and a binder phase, wherein the sintered material includes: the cubic boron nitride grains in a range of 40 volume % or more and less than 60 volume %; and Al in a range from a lower limit of 2 mass % to an upper limit Y, satisfying a relationship, $Y=-0.1X+10$, Y and X being an Al content in mass % and a content of the cubic boron nitride grains in volume %, respectively, the binder phase includes: at least a Ti compound; $Al_2O_3$; and inevitable impurities, the $Al_2O_3$ includes fine $Al_2O_3$ grains with a diameter of 10 nm to 100 nm dispersedly formed in the binder phase, and there are 30 or more of the fine $Al_2O_3$ grains generated in an area of 1 μm×1 μm in a cross section of the binder phase.

(2) The cubic boron nitride sintered material cutting tool according to the above-described (1), further including a hard coating layer deposited on a surface of the cutting tool body.

(3) The cubic boron nitride sintered material cutting tool according to the above-described (2), wherein the hard coating layer includes at least a titanium nitride coating.

(4) The cubic boron nitride sintered material cutting tool according to the above-described (3), wherein the hard coating layer is made of a single layer of the titanium nitride coating.

(5) The cubic boron nitride sintered material cutting tool according to the above-described (3), wherein the hard coating layer is made of: a single layer of the titanium nitride coating; and a single layer of a titanium aluminum nitride coating.

(6) The cubic boron nitride sintered material cutting tool according to any one of the above-described (2) to (5), wherein a layer thickness of the hard coating layer is in a range of 1.0 μm to 2.5 μm.

(7) The cubic boron nitride sintered material cutting tool according to the above-described (1), wherein there are 60 or more of the fine $Al_2O_3$ grains generated in the area of 1 μm×1 μm in the cross section of the binder phase.

(8) The cubic boron nitride sintered material cutting tool according to the above-described (1), wherein there are 90 or more of the fine $Al_2O_3$ grains generated in the area of 1 μm×1 μm in the cross section of the binder phase.

(9) The cubic boron nitride sintered material cutting tool according to the above-described (1), wherein the diameter of the fine $Al_2O_3$ grains dispersedly formed in the binder phase is in the range of 10 nm to 85 nm.

(10) The cubic boron nitride sintered material cutting tool according to the above-described (1), wherein the diameter of the fine $Al_2O_3$ grains dispersedly formed in the binder phase is in the range of 10 nm to 60 nm.

(11) The cubic boron nitride sintered material cutting tool according to the above-described (1), wherein a median diameter of the $Al_2O_3$ existing in the binder phase is in a range of 60 nm to 85 nm.

(12) The cubic boron nitride sintered material cutting tool according to the above-described (1), wherein a median diameter of the $Al_2O_3$ existing in the binder phase is in a range of 60 nm to 70 nm.

Effects of the Invention

The cutting tool related to the present invention (hereinafter, referred as "the cutting tool of the present invention") is the cBN sintered material cutting tool having the cutting tool body, which is the sintered material including cBN grains and the binder phase. In the cutting tool of the present invention, the sintered material includes: the cubic boron nitride grains in the range of 40 volume % or more and less than 60 volume %; and Al in the range from the lower limit of 2 mass % to the upper limit Y, satisfying a relationship, $Y=-0.1X+10$, Y and X being an Al content in mass % and a content of the cubic boron nitride grains in volume %, respectively. In addition, the binder phase includes: at least the Ti compound; $Al_2O_3$; and inevitable impurities; the $Al_2O_3$ includes fine $Al_2O_3$ grains with the diameter of 10 nm to 100 nm dispersedly formed (existing in an uniformly dispersed state) in the binder phase; and there are 30 or more of the fine $Al_2O_3$ grains generated in the area of 1 μm×1 μm in the cross section of the binder phase. By having these special configurations of the cutting tool of the present invention, fracturing and chipping are suppressed in the cutting tool of the present invention; and extension of the tool life of the cutting tool is achieved.

DETAILED DESCRIPTION OF THE INVENTION

Embodiments of the present invention are explained below.

The Content of cBN Grains in the cBN Sintered Material:

Normally, the cBN sintered material is made of cBN grains as the hard phase component and binder phase component. The cBN sintered material, which constitutes the cutting tool body of the cBN sintered material cutting tool of the present invention, contains: at least one or more of Ti compounds selected from titanium nitride, titanium carbide, titanium carbonitride, titanium boride, titanium oxide, and a solid solution thereof; and $Al_2O_3$, as the binder phase component.

If the content of cBN grains in the cBN sintered material were less than 40 volume %, hardness of the cBN sintered material tool would become insufficient due to the reduced amount of the hard material in the sintered material. Thus, fracturing resistance deteriorates when it is used as a cutting tool. On the other hand, if the content of cBN grains in the cBN sintered material were 60 volume % or more, the ratio of the binder phase in the sintered material would be relatively reduced. Thus, the toughness improving effect, which is contributed from the binder phase, cannot be obtained sufficiently. Therefore, it is preferable that the content of cBN grains in the cBN sintered material is set in the range from 40 volume % or more to less than 60 volume % in order to obtain the effect of the present invention more effectively.

The content of cBN grains (volume %) in the cBN sintered material can be calculated based on the secondary electron image obtained by observing the cross-section structure of the cBN sintered material by the scanning electron microscopy (SEM). The parts corresponding to the cBN grains in the obtained secondary electron image can be extracted by image processing. After identifying the parts corresponding to the cBN grains, the value, which is the calculated area occupied by the cBN grains by image processing, is obtained. Then, by dividing the value by the image total area, the area ratio of the cBN grains can be calculated. Then, by regarding this area ratio as the volume %, the content of cBN grains (volume %) can be measured. In this measurement, the average value, which is obtained by processing at least 3 secondary electron images magnified 5,000 times with the scanning electron microscopy, is treated as the content of cBN grains (volume %). In the case where the average grain size of the cBN grains is about 3 µm, it is preferable that the viewing area with the dimension of about 20 µm×20 µm is used as the observing area for the image processing.

The Average Grain Size of cBN Grains:

The average grain size of the cBN grains, which are used for making the cutting tool of the present invention, is not particularly limited. However, it is preferable that the average grain size is in the range of 0.5 µm to 8.0 µm.

In addition to the fracturing resistance improving effect due to including the hard cBN grains in the sintered material, the cBN sintered material can obtain even more excellent fracturing resistance by having the cBN grains with the average grain size of 0.5 µm to 8.0 µm being dispersed in the sintered material, since: not only fracturing and chipping, which are started from a start point with a convex-concave shape on the cutting edge formed by falling off of cBN grains on the tool surface during use of the tool, are suppressed; but cracking, which is formed by the stress applied on the cutting edge during use of the tool and extends from the interface between the cBN grain and the binder phase, or propagation of cracks, which extends with cracking of the cBN grain, are suppressed by the cBN grains dispersing in the sintered material and having the predetermined grain size.

Therefore, it is preferable that the average grain size of the cBN grains used for making the cutting tool of the present invention is set to the range of 0.5 µm to 8.0 µm.

Figure 1:
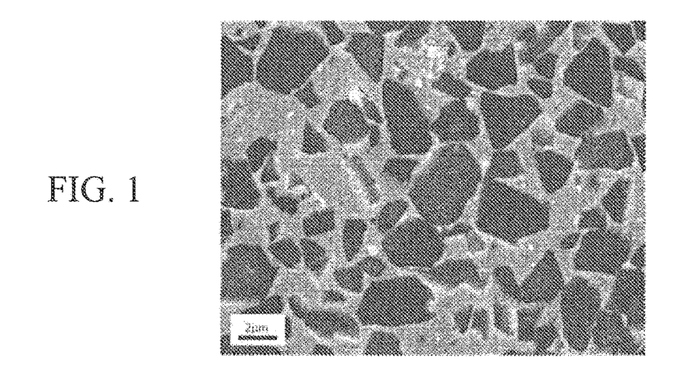
FIG. 1 shows cBN extracted by image analysis of the secondary electron image obtained by SEM in a cross-section of the cBN sintered material.

The average grain size of the cBN grains can be obtained based on the secondary electron image obtained by observing the cross-section structure of the produced cBN sintered material by SEM. First, the parts corresponding to the cBN grains within the obtained image are extracted by binarization in the image processing as shown in FIG. 1. After identifying the parts corresponding to the cBN grains, the maximum length of each cBN grain is obtained by image processing, and it is regarded as the diameter of each cBN grain. Then, a graph is drawn by defining the vertical axis as the cumulative volume ratio (volume %) and the horizontal axis as the diameter (µm), based on the volume of each grain obtained by calculation from the diameter; and the diameter, in which the cumulative volume ratio is the value of 50 volume %, is regarded as the average grain size of the cBN grains. In this measurement, the average value, which is obtained by processing at least 3 secondary electron images magnified 5,000 times with the SEM, is treated as the average grain size cBN grains (µm). In the case where the average grain size of the cBN grains is about 3 µm, it is preferable that the viewing area with the dimension of about 20 µm×20 µm is used as the observing area for the image processing.

Al Content in the cBN Sintered Material:

If the Al content in the cBN sintered material were less than 2 mass %, the amount of $Al_2O_3$ generated in the binder phase would be reduced; and the crack extension would not be suppressed sufficiently. Thus, the toughness improving effect of the cBN sintered material cannot be obtained sufficiently. On the other hand, if the Al content Y in the cBN sintered material exceeded the value, $Y=-0.1X+10$ when Y is the Al content (mass %) and X is the content of cBN grains (volume %), the amounts of AlN and $Al_2O_3$ formed in the binder phase increase. Furthermore, because of growth of these AlN and $Al_2O_3$ grains being proceeded to be coarse grains, toughness of the cBN sintered material deteriorates.

Therefore, it is preferable that the Al content in the cBN sintered material is set to the range from the lower limit of 2 mass % to the upper limit Y satisfying the relationship, $Y=-0.1X+10$, when Y is the Al content (mass %) and X is the content of cBN grains (volume %).

The above-described Al content means the total content of Al contained in the all of Al, $Al_2O_3$, and TiAl used in the crushing process of the raw material powders for the binder phase formation.

The Measurement Method of the Al Content in the cBN Sintered Material:

Qualitative and quantitative analysis of the cBN sintered material is performed by using Electron Probe Micro Analyser (EPMA). The Al content (mass %) in the cBN sintered material is obtained by ZAF matrix correction method on the detected elements in the qualitative analysis.

The Grain Size of the $Al_2O_3$ Grain in the Binder Phase and the Number per Unit Area:

If the grain size of the $Al_2O_3$ grain in the binder phase were the diameter of less than 10 nm, it would be possible that toughness of the cBN sintered material deteriorates since contamination of impurities, such as oxygen, water, and the like, increases. On the other hand, if the grain size of the $Al_2O_3$ grain in the binder phase were the diameter exceeding 100 nm, it would be possible that crack extension is not suppressed sufficiently since the number of the $Al_2O_3$ grains is reduced relatively. In addition, if the number of the $Al_2O_3$ grains in the region of 1 µm×1 µm in the cross-section of the binder phase were less than 30, crack extension would not be suppressed sufficiently.

Therefore, the size of the $Al_2O_3$ grains in the binder phase is set to the diameter range of 10 nm to 100 nm; and the number of the $Al_2O_3$ grains in the region of 1 µm×1 µm in the cross-section of the binder phase is set to 30 or more.

A preferable diameter range of the fine $Al_2O_3$ grains dispersedly formed in the binder phase is 10 nm to 85 nm.

A more preferable diameter range of the fine $Al_2O_3$ grains dispersedly formed in the binder phase is 10 nm to 60 nm.

A preferable median diameter range of the $Al_2O_3$ existing in the binder phase is the diameter of 60 nm to 85 nm.

A more preferable median diameter range of the $Al_2O_3$ existing in the binder phase is the diameter of 60 nm to 70 nm.

A preferable number of the fine $Al_2O_3$ grains in the region of 1 µm×1 µm in the cross-section of the binder phase is 60 or more.

A more preferable number of the fine $Al_2O_3$ grains in the region of 1 µm×1 µm in the cross-section of the binder phase is 90 or more.

The upper limit of the number of the fine $Al_2O_3$ grains in the region of 1 µm×1 µm in the cross-section of the binder phase is 200 taking the cost-effectiveness into consideration. A more preferable upper limit of the fine $Al_2O_3$ grains is 150. An even more preferable upper limit of the fine $Al_2O_3$ grains is 130.

Figure 2A:
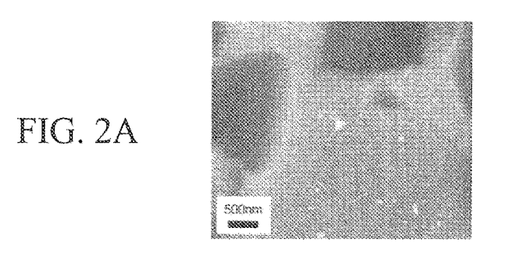
FIG. 2A shows the secondary electron image by AES in the cross-section of the cBN sintered material.
Figure 2B:
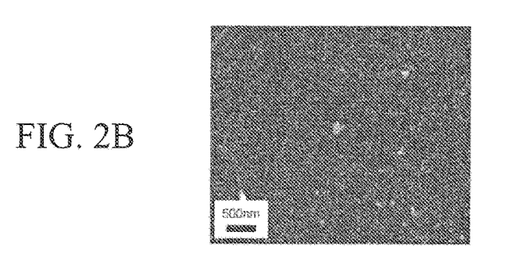
FIG. 2B shows an Al elemental mapping image in the cross-section of the cBN sintered material.
Figure 2C:
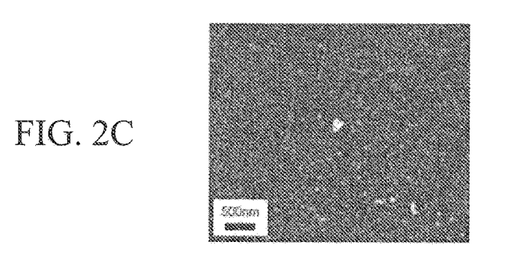
FIG. 2C shows an O (oxygen) elemental mapping image in the cross-section of the cBN sintered material.
Figure 2D:
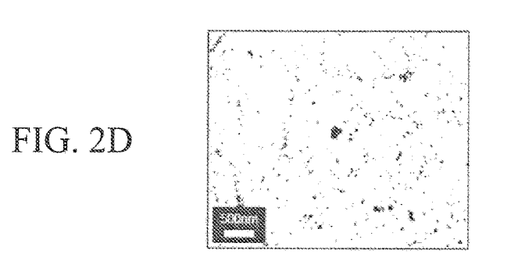
FIG. 2D shows an image that Al2O3 is extracted in the cross-section of the cBN sintered material.

Measurement methods of the grain size; the median diameter; and the number per unit area of the $Al_2O_3$ grains in the binder phase:

The grain size and the number per unit area of the $Al_2O_3$ grains in the binder phase are measured: by observing the binder phase structure of the cBN sintered material by Auger Electron Spectroscopy (AES); and by obtaining the elemental mapping image of the elements Al and O (refer FIGS. 2A, 2B, 2C, and 2D). Then, the parts, in which these obtained Al mapping image and O (oxygen) mapping image are overlapped, are identified by image analysis; and the $Al_2O_3$ grains are extracted by image processing (FIG. 2D). After extracting the parts corresponding to the $Al_2O_3$ grains, the maximum length of each $Al_2O_3$ grain is obtained by image analysis. When referring to the grain size of the each $Al_2O_3$ grain (the grain size of the $Al_2O_3$ grain), the obtained maximum length of the $Al_2O_3$ grain is regarded as the diameter of the $Al_2O_3$ grain. When referring to the average grain size of multi $Al_2O_3$ grains (the median grain diameter of the $Al_2O_3$ grains), the obtained maximum length of each $Al_2O_3$ grain is regarded as the diameter of the each $Al_2O_3$ grain; and the graph, the vertical and horizontal axes of which are the cumulative volume ratio (volume %) and the diameter (nm), respectively, is drawn based on volumes of the each $Al_2O_3$ grain obtained from calculation from the diameter. Then, the diameter with the cumulative volume ratio of 50 volume % is regarded as the median diameter of the subjected multi $Al_2O_3$ grains. In this measurement, the value and the average value, which are obtained by processing at least 3 secondary electron images magnified 5,000 times with SEM, are treated as the grain size of the $Al_2O_3$ grain (nm); and the median diameter of the $Al_2O_3$ grains (nm). In addition, from the elemental mapping images subjected to image analysis, the number of the $Al_2O_3$ grains, which have the diameter of 10 nm to 100 nm within the area of 1 μm×1 μm in the cross section of the binder phase, is calculated.

A hard coating layer may be deposited on the surface of the cutting tool body of the cBN cutting tool of the present invention.

The hard coating layer may include at least a titanium nitride coating.

The hard coating layer may be made of a single layer of a titanium nitride coating.

The hard coating layer may be made of a single layer of a titanium nitride coating and a single layer of a titanium aluminum nitride coating.

The layer thickness of the hard coating layer may be in the range of 1.0 μm to 2.5 μm.

The cBN sintered material cutting tool of the present invention is specifically explained based on Examples below.

EXAMPLES

As the raw material powders for the binder phase formation, the Ti compound powder (for example, the TiN powder; the TiC powder; the TiCN powder; the TiAl powder; and the like); and the fine $Al_2O_3$ grains having the grain size less than 100 nm (the fine $Al_2O_3$ powder includes the ultra-fine $Al_2O_3$ powder having the average grain size of 5 nm to 15 nm) or the Al powder and the $Al_2O_3$ powder having the grain size exceeding 100 nm were prepared. Next, the above-mentioned raw material powders were blended in the blending compositions shown in Table 1; and filled in the pot, which had the cemented carbide lining, with the cemented carbide balls made of tungsten carbide; and acetone for example. In addition, the amine-based or carboxylic acid-based dispersant was added in order to stimulate dispersion of the fine and ultra-fine $Al_2O_3$ grains if it was needed. Then, after putting a lid, the raw material powders were crushed by performing crushing and mixing for the rotating ball mill treating times shown in Table 2 by using the rotating ball mill.

Next, the cBN content after sintering was adjusted at 40 volume % or more and less than 60 volume % by adding the cBN powder having the average grain size of 0.5 μm to 8.0 μm in the mass % shown in Table 2; and 24-hour mixing was performed by the rotating ball mill.

After performing wet-mixing by the rotating ball mill and drying, the mixed material was subjected to press-molding under the pressure of 120 MPa to obtain the green compacts having the dimension of: 50 mm of the diameter; and 15 mm of the thickness. Then, these green compacts were sintered under the condition: under the vacuum atmosphere with the pressure of $1×10^{-4}$ Pa or less; and at the temperature range of 900° C. to 1300° C., to be preliminary sintered materials. It is preferable that the processes from crushing to molding are performed under the inert atmosphere. These preliminary sintered materials were inserted into the ultra-high pressure and temperature sintering apparatus, in the state where the preliminary sintered material was stacked to the separately-prepared supporting piece made of the WC-based cemented carbide alloy having the composition of 8 mass % of Co and the WC balance; and the dimension of the diameter of 50 mm and the thickness of 2 mm. Then, they were subjected to ultra-high pressure sintering in the condition: under the pressure of 5 GPa, at the temperature of 1200° C. to 1400° C.; and the retention time of 30 minutes to produce the cBN sintered materials 1 to 8 of the present invention (hereinafter, referred as Examples 1 to 8 of the present invention).

Nucleation and uniform dispersion of the fine $Al_2O_3$ grains were stimulated, by adding the ultra-fine $Al_2O_3$ powder having the average grain size of 5 nm to 15 nm at 0.1 mass % to 2 mass % during crushing of the raw material powers for the binder phase formation in the present invention. Accordingly, the fine $Al_2O_3$ grains having the diameter of 10 nm to 100 nm obtained the dispersed distribution in the binder phase shown in FIGS. 2B to 2D.

For comparison, comparative cBN sintered materials 1 to 7 (hereinafter, referred as Comparative Examples 1 to 7) were produced. In making Comparative Examples 1 to 7, raw material powders were blended in the blending compositions shown in Table 1 in either the method as in Examples of the present invention; or the method where the ultra-fine or fine $Al_2O_3$ grains were not added. Then, the mixed materials were crushed and mixed for the rotating ball mill treatment times shown in Table 2. Then, the cBN powders shown in Table 2 were added; and ultra-high pressure sintering was performed under the predetermined condition.

TABLE 1

| | | Blending composition (mass %) | | | | | | | |
|---|---|---|---|---|---|---|---|---|---|
| Type | | TiN | TiC | TiCN | TiAl | Al | $Al_2O_3$ | Fine $Al_2O_3$ grains | Ultra-fine $Al_2O_3$ grains |
| Raw material powder | 1 | 95.2 | — | — | 2.5 | 1.5 | — | — | 0.8 |
| | 2 | — | 85.1 | — | 10.0 | 2.9 | — | — | 2.0 |
| | 3 | 92.0 | — | — | 5.5 | 1.8 | — | — | 0.7 |
| | 4 | 92.8 | — | — | 5.5 | 1.1 | — | 0.5 | 0.1 |
| | 5 | — | 85.1 | — | 2.5 | 1.3 | — | — | 0.5 |
| | 6 | 90.8 | — | — | 5.0 | 2.7 | — | — | 1.5 |
| | 7 | — | — | 94.5 | 4.0 | 1.1 | — | — | 0.4 |
| | 8 | 87.9 | — | — | 7.0 | 4.2 | — | — | 0.9 |
| | 9 | 82.4 | — | — | 12.0 | — | 5.6 | — | — |
| | 10 | 84.0 | — | — | 10.0 | — | 6.0 | — | — |
| | 11 | 98.2 | — | — | 1.0 | 0.8 | — | — | — |

TABLE 1-continued

| Type | Blending composition (mass %) | | | | | | |
|---|---|---|---|---|---|---|---|
| | TiN | TiC | TiCN | TiAl | Al | Fine Al$_2$O$_3$ grains | Ultra-fine Al$_2$O$_3$ grains |
| 12 | 97.5 | — | — | 1.5 | 1.0 | — | — |
| 13 | 89.6 | — | — | 7.0 | 3.4 | — | — |
| 14 | — | 74.5 | — | 18.0 | 7.5 | — | — |
| 15 | 76.2 | — | — | 18.0 | 5.8 | — | — |

TABLE 2

| | Type | Raw material powder type (refer Table 1) | Ball mill treatment time (hr) | cBN powder Relative additive amount to the total powder (mass %) |
|---|---|---|---|---|
| Cubic boron nitride based ultra-high pressure sintered materials | Example 1 | 1 | 96 | 35.6 |
| | Example 2 | 2 | 120 | 38.9 |
| | Example 3 | 3 | 120 | 44.1 |
| | Example 4 | 4 | 120 | 53.2 |
| | Example 5 | 5 | 120 | 37.6 |
| | Example 6 | 6 | 96 | 36.6 |
| | Example 7 | 7 | 96 | 44.9 |
| | Example 8 | 8 | 96 | 54.1 |
| | Comparative Example 1 | 9 | 48 | 28.8 |
| | Comparative Example 2 | 10 | 48 | 64.9 |
| | Comparative Example 3 | 11 | 96 | 27.7 |
| | Comparative Example 4 | 12 | 72 | 43.5 |
| | Comparative Example 5 | 13 | 24 | 44.6 |
| | Comparative Example 6 | 14 | 96 | 49 |
| | Comparative Example 7 | 15 | 72 | 56.5 |

In the above-described Examples 1 to 8 of the present invention and Comparative Examples 1 to 7, the Al content in the cBN sintered material; the median diameter of the Al$_2$O$_3$ grains in the binder phase; the number of the fine Al$_2$O$_3$ grains having the diameter of 10 nm to 100 nm per unit area; and the cBN content in the cBN sintered material, were measured. Results of these measurements are shown in Table 3.

When binder phase structures of Examples 1 to 8 of the present invention and Comparative Examples 1 to 7 were analyzed by using the X-ray diffractometer, existence of the diffraction peaks of TiN, TiB$_2$, and AlN was confirmed. However, the existence of the diffraction peak of the AlB$_2$ was not confirmed. Thus, there was no AlB$_2$ in the binder phase.

TABLE 3

| | Type | Raw material powder type (refer Table 1) | In the sintered material structure | | | |
|---|---|---|---|---|---|---|
| | | | Al content (mass %) | median diameter of Al$_2$O$_3$ (nm) | Number of Al$_2$O$_3$ having the diameter of 10 nm to 100 nm per unit area (Number/μm$^2$) | cBN content (volume %) |
| Cubic boron nitride based ultra-high pressure sintered material | Example 1 | 1 | 2.1 | 70 | 45 | 40.4 |
| | Example 2 | 2 | 5.9 | 68 | 130 | 40.8 |
| | Example 3 | 3 | 3 | 60 | 95 | 50 |
| | Example 4 | 4 | 2.1 | 60 | 63 | 59.8 |
| | Example 5 | 5 | 2.1 | 60 | 63 | 40.4 |
| | Example 6 | 6 | 4 | 100 | 65 | 40.9 |
| | Example 7 | 7 | 2 | 70 | 35 | 50 |
| | Example 8 | 8 | 4 | 85 | 44 | 59.8 |
| | Comparative Example 1 | 9 | 7 | 490 | 10 | 30.3 |
| | Comparative Example 2 | 10 | 3.1 | 390 | 9 | 70.2 |
| | Comparative Example 3 | 11 | 1 | 70 | 22 | 30.5 |
| | Comparative Example 4 | 12 | 1 | 280 | 6 | 50 |
| | Comparative Example 5 | 13 | 4.1 | 530 | 5 | 49.9 |
| | Comparative Example 6 | 14 | 9.1 | 200 | 15 | 50.9 |
| | Comparative Example 7 | 15 | 7 | 400 | 12 | 60.7 |

Next, the top and bottom surfaces of the sintered materials of the Examples 1 to 8 of the present invention and Comparative Examples 1 to 7 were polished by using the diamond grindstone; and each of the sintered materials were split into the equilateral triangle shape having the side of 3 mm by the wire-electrical discharge machine. Then, each of them was brazed on the brazing part (the corner part) of the chip main body made of WC-based cemented carbide alloy, which had the composition of 5 mass % of Co, 5 mass % of TaC and the WC balance; and the shape of CNGA120408 in ISO Standard (rhombic shape having the thickness of 4.76 mm and the side of 12.7 mm), by using the brazing material made of Ag alloy having the composition of 25 mass % of Cu, 5 mass % of Ti, 2.5 mass % of Ni, and the Ag balance. Finally, by performing final polishing, the cutting tools 1 to 8 of the present invention and the comparative cutting tools 1 to 7 having the insert shape of CNGA120408 in ISO Standard were produced.

Figure 3A:
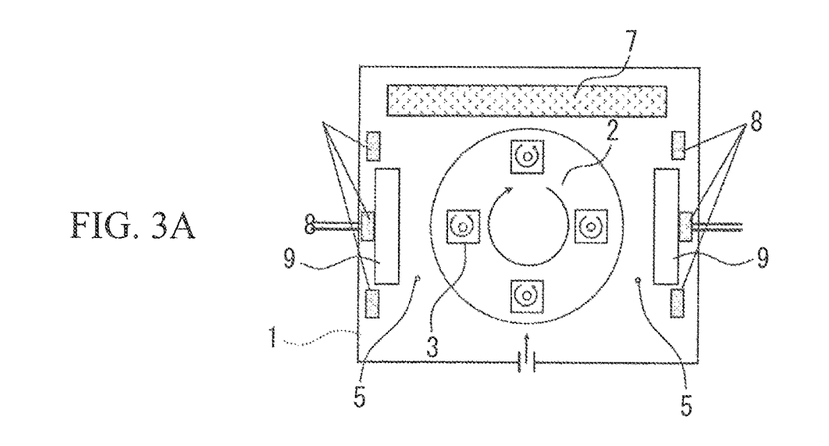
FIG. 3A shows a schematic plan view of the arc-ion plating apparatus 1 used in the deposition of the hard coating layer in the cutting tool of the present invention.
Figure 3B:
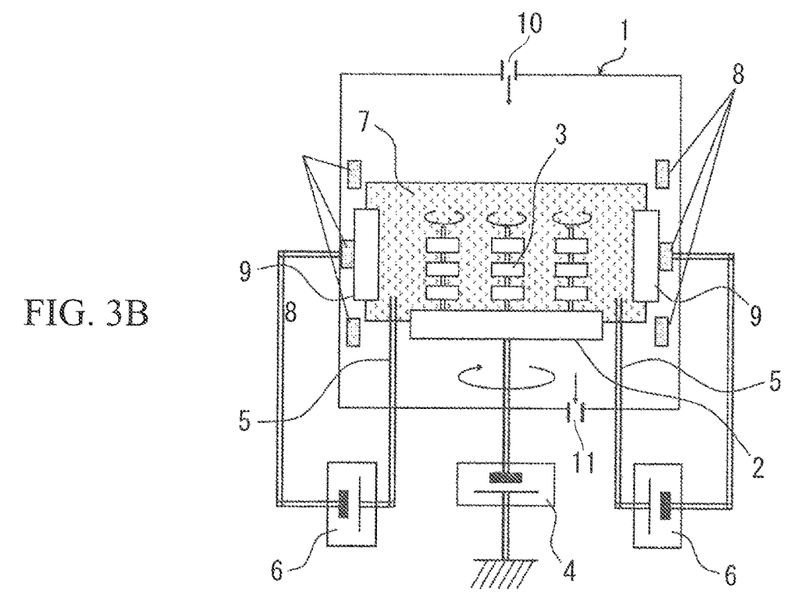
FIG. 3B shows a schematic side view of the arc-ion plating apparatus 1 used in the deposition of the hard coating layer in the cutting tool of the present invention.

To the cutting tools 2, 4, 6 and 8 of the present invention, the hard coating layers shown in Table 4 were formed in the layer thickness shown in Table 4 to coat the outermost surfaces thereof by the physical vapor deposition apparatus shown in FIGS. 3A and 3B. Accordingly, the surface coated cutting tools 2, 4, 6 and 8 of the present invention (hereinafter, referred as the coated cutting tools of the present invention) were produced.

The above-described physical vapor deposition apparatus (the arc ion plating apparatus 1) had the rotation table 2 rotating in the middle of the chamber. On the rotation table 2, multiple rotating shafts, each of which extended in the vertical direction, were provided (4 shafts in the example shown in the drawings). Multiple cemented carbide bodies 3 were held by the each of the rotating shafts in the state that they were skewered with the each of the rotating shafts. The rotation 2 rotated, and the multiple rotating shafts provided on the rotation table 2 rotated at the same time. Below the rotation table 2, the bias electric power supply was provided.

In the chamber, a pair of the metal Ti or Ti—Al alloy targets 9 (cathode electrodes) were provided in such a way that the rotation table 2 was sandwiched from the left and right. Behind the each of the metal Ti or Ti—Al alloy targets 9 from the rotation table 2, the multiple magnetic force generating sources 8 (permanent magnets) were provided. The each of the metal Ti or Ti—Al alloy targets 9 were connected to the arc electric power supply 6. The side of the arc electric power supply 6 not connected to the metal Ti or Ti—Al alloy targets 9 was connected to the anode electrode 5. A pair of the anode electrodes 5 was provided in the chamber in such a way that they sandwiched the rotation table 2 from the left and right.

The heater 7 was provided in the chamber and on the side where the metal Ti or Ti—Al alloy targets 9 were not provided, in such a way that the heater 7 faced the side surface of the rotation table.

In the upper part of the chamber, the reaction gas inlet 10 was provided. In the lower part of the chamber, the exhaust gas outlet 11 was provided.

TABLE 4

| Type | Hard coating layer type (Number in parenthesizes indicates the average layer thickness in μm) |
|---|---|
| The coated cutting tool 2 of the present invention | TiN (1.0) |
| The coated cutting tool 4 of the present invention | |
| The coated cutting tool 6 of the present invention | TiN (1.0)—TiAlN (1.5) |
| The coated cutting tool 8 of the present invention | |

Next, in the state where each of the above-described cutting tools was screwed on the tip part of the insert holder of tool steel with the jig to be fixed, continuous cutting tests were performed on: the cutting tools 1 to 8 of the present invention; the coated cutting tools 2, 4, 6 and 8 of the present invention; and the comparative cutting tools 1 to 7, in the cutting conditions 1 and 2 shown below.

[Cutting Condition 1]
Work: Round rod of JIS.SCr420 carbolized steel (hardness: HRC61)
Cutting speed: 220 m/min
Cutting depth: 0.2 mm
Feed: 0.15 mm/rev.
The tool life was defined as the cutting time until the cutting edge of the cutting tool was fractured.

[Cutting Condition 2]
Work: JIS·SCr420 carbolized steel (hardness: HRC61) having one slit having the width of 10 mm in the longitudinal direction
Cutting speed: 150 m/min
Cutting depth: 0.2 mm
Feed: 0.2 mm/rev.
The tool life was defined as the cutting time until the cutting edge of the cutting tool was fractured.

Results of the cutting tests in the cutting conditions 1 and 2 are shown in Table 5.

TABLE 5

| Type | Cutting condition 1 Tool life (sec) | Cutting condition 2 Tool life (sec) |
|---|---|---|
| The cutting tool 1 of the present invention | 595 | 159 |
| The cutting tool 2 of the present invention | 700 | 180 |
| The cutting tool 3 of the present invention | 690 | 177 |
| The cutting tool 4 of the present invention | 650 | 170 |
| The cutting tool 5 of the present invention | 650 | 170 |
| The cutting tool 6 of the present invention | 660 | 172 |
| The cutting tool 7 of the present invention | 550 | 150 |
| The cutting tool 8 of the present invention | 555 | 152 |
| The coated cutting tool 2 of the present invention | 710 | 185 |
| The coated cutting tool 4 of the present invention | 660 | 175 |
| The coated cutting tool 6 of the present invention | 690 | 182 |
| The coated cutting tool 8 of the present invention | 585 | 162 |
| The comparative cutting tool 1 | 315 | 48 |
| The comparative cutting tool 2 | 330 | 52 |
| The comparative cutting tool 3 | 400 | 110 |
| The comparative cutting tool 4 | 320 | 50 |
| The comparative cutting tool 5 | 200 | 30 |
| The comparative cutting tool 6 | 390 | 80 |
| The comparative cutting tool 7 | 360 | 60 |

Based on the results shown in Table 5, it was demonstrated that fracturing and chipping were less likely to occur in cutting of the high hardness steel in the cutting tools 1 to 8 of the present invention; and the coated cutting tools 2, 4, 6, and 8; and they exhibited excellent cutting performance for a long-term usage. It was because: the fine $Al_2O_3$ grains having the diameter of 10 nm to 100 nm as the median diameter were dispersedly formed in the binder phase (existed in an uniformly dispersed state); and there were 30 or more of the fine $Al_2O_3$ grains generated in the area of 1 μm×1 μm in the cross section of the binder phase in the cutting tools 1 to 8 of the present invention; and the coated cutting tools 2, 4, 6, and 8. In addition, the cutting performance was further improved by depositing the hard coating layer on the surfaces of the cutting tool bodies in the coated cutting tools of the present invention without deteriorating the above-described characteristics.

Contrary to that, clearly any one of the comparative cutting tools 1 to 7 reached to the tool life in a relatively short time in the cutting work of the high hardness steel since $Al_2O_3$ in the binder phase did not have the characteristics of the cutting tools of the present invention.

INDUSTRIAL APPLICABILITY

As described above, the cBN cutting tool of the present invention has the excellent chipping resistance and fracturing resistance. Thus, it can be utilized not only to cutting of the high hardness steel, but to cutting under varieties of conditions. Therefore, the present invention is satisfactory applicable to: high-performance cutting work apparatuses; and power-saving, energy-saving; and reduction of costs in cutting work.

REFERENCE SIGNS LIST

1: Arc ion plating apparatus
2: Rotation table
3: Cemented carbide body
4: Bias electric power supply
5: Anode electrode
6: Arc electric power supply
7: Heater
8: Magnetic force generating source (permanent magnet)
9: Metal Ti or Ti—Al alloy target (cathode electrode)
10: Reaction gas inlet
11: Exhaust gas outlet

The invention claimed is:

1. A cubic boron nitride sintered material cutting tool comprising:
a cutting tool body, which is a sintered material including cubic boron nitride grains and a binder phase, wherein
the sintered material comprises: the cubic boron nitride grains in a range of 40 volume % or more and less than 60 volume %; and Al in a range from a lower limit of 2 mass % to an upper limit Y, satisfying a relationship, Y=−0.1X+10, Y and X being an Al content in mass% and a content of the cubic boron nitride grains in volume %, respectively,
the binder phase comprises: at least a Ti compound; $Al_2O_3$; and inevitable impurities,
the $Al_2O_3$ includes fine $Al_2O_3$ grains with a diameter of 10 nm to 100 nm evenly dispersed in the binder phase, and there are 30 or more of the fine $Al_2O_3$ grains generated in an area of 1 μm×1 μm in a cross section of the binder phase.

2. The cubic boron nitride sintered material cutting tool according to claim 1, further comprising a hard coating layer deposited on a surface of the cutting tool body.

3. The cubic boron nitride sintered material cutting tool according to claim 2, wherein the hard coating layer includes at least a titanium nitride coating.

4. The cubic boron nitride sintered material cutting tool according to claim 3, wherein the hard coating layer is made of a single layer of the titanium nitride coating.

5. The cubic boron nitride sintered material cutting tool according to claim 3, wherein the hard coating layer is made of: a single layer of the titanium nitride coating; and a single layer of a titanium aluminum nitride coating.

6. The cubic boron nitride sintered material cutting tool according to claim 2, wherein a layer thickness of the hard coating layer is in a range of 1.0 μm to 2.5 μm.

7. The cubic boron nitride sintered material cutting tool according to claim 1, wherein there are 60 or more of the fine $Al_2O_3$ grains generated in the area of 1 μm×1 μm in the cross section of the binder phase.

8. The cubic boron nitride sintered material cutting tool according to claim 1, wherein there are 90 or more of the fine $Al_2O_3$ grains generated in the area of 1 μm×1 μm in the cross section of the binder phase.

9. The cubic boron nitride sintered material cutting tool according to claim 1, wherein the diameter of the fine $Al_2O_3$ grains dispersedly formed in the binder phase is in the range of 10 nm to 85 nm.

10. The cubic boron nitride sintered material cutting tool according to claim 1, wherein the diameter of the fine $Al_2O_3$ grains dispersedly formed in the binder phase is in the range of 10 nm to 60 nm.

11. The cubic boron nitride sintered material cutting tool according to claim 1, wherein a median diameter of the $Al_2O_3$ existing in the binder phase is in a range of 60 nm to 85 nm.

12. The cubic boron nitride sintered material cutting tool according to claim 1, wherein a median diameter of the $Al_2O_3$ existing in the binder phase is in a range of 60 nm to 70 nm.

13. The cubic boron nitride sintered material cutting tool according to claim 3, wherein a layer thickness of the hard coating layer is in a range of 1.0 μm to 2.5 μm.

14. The cubic boron nitride sintered material cutting tool according to claim 4, wherein a layer thickness of the hard coating layer is in a range of 1.0 μm to 2.5 μm.

15. The cubic boron nitride sintered material cutting tool according to claim 5, wherein a layer thickness of the hard coating layer is in a range of 1.0 μm to 2.5 μm.

16. The cubic boron nitride sintered material cutting tool according to claim 1, wherein an average grain size of the cubic boron nitride grains is in a range of 0.5 μm to 8.0 μm.

* * * * *